United States Patent
Hino et al.

(10) Patent No.: US 9,588,265 B2
(45) Date of Patent: Mar. 7, 2017

(54) COLOR FILTER FORMING SUBSTRATE, METHOD OF MANUFACTURING SAME AND DISPLAY DEVICE

(75) Inventors: Kazuyuki Hino, Tokyo-to (JP); Seiji Tawaraya, Tokyo-to (JP); Hiroki Sakata, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/003,344

(22) PCT Filed: Jul. 3, 2012

(86) PCT No.: PCT/JP2012/066965
§ 371 (c)(1),
(2), (4) Date: Sep. 5, 2013

(87) PCT Pub. No.: WO2013/008679
PCT Pub. Date: Jan. 17, 2013

(65) Prior Publication Data
US 2013/0342927 A1    Dec. 26, 2013

(30) Foreign Application Priority Data

Jul. 11, 2011   (JP) .................................. 2011-152463
Jun. 15, 2012   (JP) .................................. 2012-135335

(51) Int. Cl.
*G02B 5/22*      (2006.01)
*G02B 5/20*      (2006.01)
(Continued)

(52) U.S. Cl.
CPC .............. *G02B 5/22* (2013.01); *G02B 5/201* (2013.01); *G02F 1/133512* (2013.01); *G02F 1/133514* (2013.01); *G02F 2001/133388* (2013.01)

(58) Field of Classification Search
CPC ............. G02F 1/1335; G02F 1/133512; G02F 1/133514; G02B 5/22; G02B 5/201; B44C 1/22
(Continued)

(56) References Cited

U.S. PATENT DOCUMENTS 6,476,890 B1 *  11/2002  Funahata ..........  G02F 1/133512
                                                            349/110
2003/0218706 A1  11/2003  Takizawa et al.
(Continued)

FOREIGN PATENT DOCUMENTS

JP    11-271757 A    10/1999
JP    2001-183647 A   7/2001
(Continued)

OTHER PUBLICATIONS

International Search Report mailed Aug. 7, 2012; PCT/JP2012/066965.

*Primary Examiner* — Bumsuk Won
*Assistant Examiner* — William R Alexander
(74) *Attorney, Agent, or Firm* — Ladas & Parry LLP

(57) ABSTRACT

A color filter forming substrate used in a multifunctional terminal is provided which has a frame disposed surrounding respective colored layers for a color filter and having a non-display area formed by the frame portion all around a boundary between the display area and the frame, and specifically has a transparent substrate as a base material; and, on one side of the base material, colored layers of respective colors for a color filter disposed in a display area and a frame portion comprising a light-shielding colored layer disposed as a region not for display around a periphery of the region for display. The color filter forming substrate is used for a display device.

4 Claims, 7 Drawing Sheets

(51) Int. Cl.
*G02F 1/1335* (2006.01)
*G02F 1/1333* (2006.01)

(58) Field of Classification Search
USPC .......... 359/887–892; 349/106, 88, 104, 108; 216/12; 430/7
See application file for complete search history.

(56) References Cited

U.S. PATENT DOCUMENTS

| | | | | |
|---|---|---|---|---|
| 2004/0201798 A1* | 10/2004 | Yeh | ................... | G02F 1/133516 349/106 |
| 2006/0006385 A1* | 1/2006 | Park | ................... | G02F 1/13458 257/59 |
| 2007/0200980 A1* | 8/2007 | Fukuchi | ............ | G02F 1/133516 349/106 |
| 2008/0001528 A1* | 1/2008 | Eida | ........................ | H01J 29/89 313/501 |
| 2008/0074769 A1* | 3/2008 | Kobayashi et al. | .......... | 359/891 |
| 2008/0123029 A1* | 5/2008 | Ko | ................... | G02F 1/133512 349/96 |
| 2008/0278664 A1* | 11/2008 | Okayama | .......... | G02F 1/133514 349/95 |
| 2008/0303985 A1* | 12/2008 | Hayashi | ............. | C09K 19/2007 349/88 |
| 2009/0128003 A1* | 5/2009 | Watanabe et al. | ............ | 313/496 |
| 2009/0257006 A1* | 10/2009 | Ko et al. | ........................ | 349/106 |
| 2010/0073615 A1* | 3/2010 | Yaguchi | ............ | G02F 1/133305 349/122 |
| 2011/0043486 A1 | 2/2011 | Hagiwara et al. | | |
| 2011/0062476 A1* | 3/2011 | Tobise | ............................ | 257/98 |
| 2011/0141398 A1* | 6/2011 | Shin | .................. | G02F 1/133555 349/64 |

FOREIGN PATENT DOCUMENTS

| | | |
|---|---|---|
| JP | 2002-072187 A | 3/2002 |
| JP | 2003-014920 A | 1/2003 |
| JP | 2007-139859 A | 6/2007 |
| JP | 2009-053893 A | 3/2009 |
| JP | 2011-065133 A | 3/2011 |
| TW | I255939 B | 6/2006 |
| WO | 2010/150668 A1 | 12/2010 |

* cited by examiner

FIG. 2A
FIG. 2B
FIG. 2C
FIG. 2D
FIG. 2E
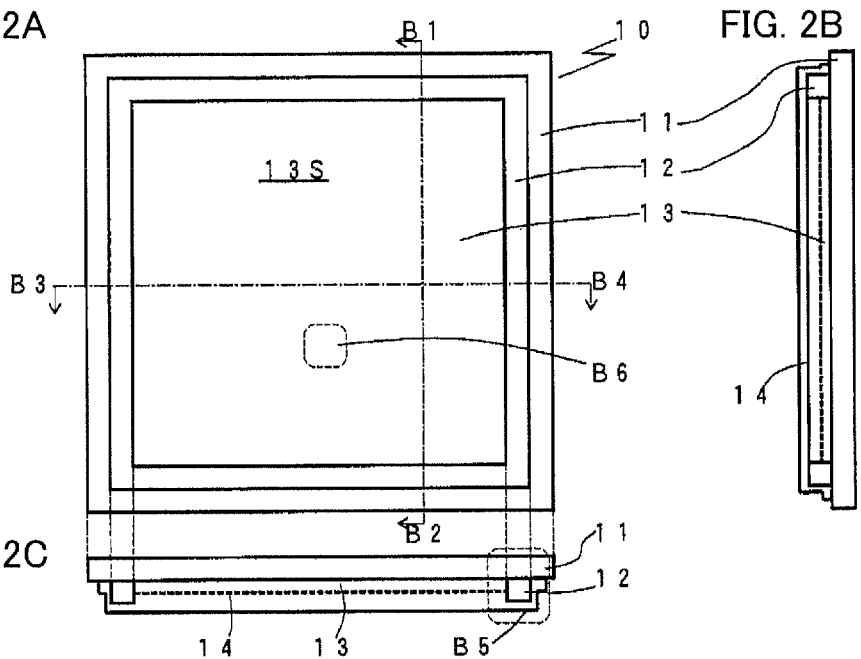
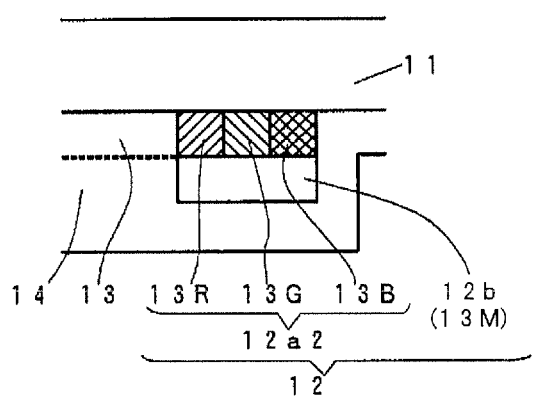
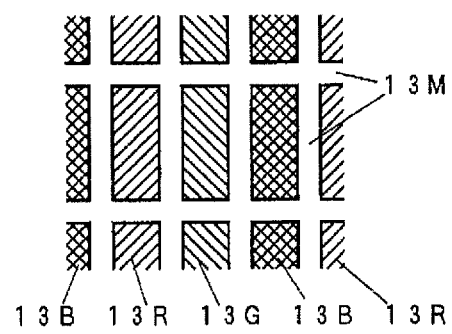

FIG. 3E

COLOR FILTER FORMING SUBSTRATE, METHOD OF MANUFACTURING SAME AND DISPLAY DEVICE

FIELD OF THE INVENTION

The present invention relates to a color filter forming substrate used for a display device, a method of manufacturing the same, and a display device. More particularly, the present invention relates to a color filter forming substrate, comprising: a transparent substrate as a base material; and, on one side of the base material, colored layers of respective colors for a color filter disposed in a region for display and a light-shielding colored layer referred to as a frame portion disposed as a region not for display around a periphery of the region for display; and the color filter forming substrate is used for a display device; and when the color filter forming substrate is used for a display device, it can solve a defect that the frame portion in a non-display area surrounding a display area looks brighter than the display area at the time display of the display device is turned off.

BACKGROUND ART

In recent years, display devices are becoming remarkably popular and, among them, liquid crystal display devices are widely used as a flat display panel.

Generally, the liquid crystal display device has a structure where a color filter forming substrate having a black matrix layer comprising a light-shielding colored layer and colored layers of respective colors disposed on one side of a transparent substrate, and a counter electrode substrate (also referred to as "TFT substrate") are disposed opposite to each other with a prescribed space, wherein liquid crystal was encapsulated. A color image is displayed by controlling light transmittance of pixels of the colored layers of respective colors by electrically controlling orientation of the liquid crystal.

In such a liquid crystal display device, quality of the color filter forming substrate governs display quality itself.

On the other hand, recently, multifunctional terminals (also referred to as high-performance terminals) are spreading extensively and tablet-type multifunctional terminals are also expected to spread rapidly. While liquid crystal display devices are being used as a display of these terminals, high display quality and good design characteristics are required of the display devices.

For example, there is a case where a tablet-type multi-functional terminal is using a color filter forming substrate 110 for a display device comprising: as shown in FIG. 6A, a transparent substrate as a base material 111; and, on one side of the base material 111, colored layers 113 of respective colors for a color filter disposed in a region for display 113S and a light-shielding colored layer referred to as a frame portion 112 disposed as a region not for display around a periphery of the region for display 113S.

FIG. 6A is a plan view of a conventional color filter forming substrate; FIG. 6B and FIG. 6C are views taken in directions of arrows along E1-E2 and E3-E4, respectively, in FIG. 6A; FIG. 6D is an enlarged view of the E5 portion of FIG. 6A; and FIG. 6E is an enlarged view of the E6 portion of FIG. 6A.

FIG. 7 is a plan view of a tablet-type multifunctional terminal 120 which uses the color filter forming substrate 110 shown in FIGS. 6A to 6E.

And, usually, the colored layers of respective colors for the color filter, the colored layer for the black matrix, and the colored layer for the frame portion have been formed by photolithography processes. And the frame portion 112 and the black matrix (not shown in the figure) have been formed together by the same photolithography process.

The tablet-type multifunctional terminal 120 usually uses the color filter forming substrate 110 shown in FIGS. 6A to 6E, where the side of the base material 111 comprising a transparent substrate faces the side of a frame 121 and a part of the frame portion 112 corresponds to the non-display area 123. A display area 122 and the non-display area 123 of about 1 mm width are so designed that they are visible from a viewer's side through an opening inside the frame 121.

The main reasons why the width of the non-display area 123 is designed to be about 1 mm as just described are to make the whole display area surely visible from a viewer and to provide some latitude in positional accuracy between a display panel using the color filter forming substrate 110 and the frame.

However, in the tablet-type multifunctional terminal 120 shown in FIG. 7, when display on the display area 122 is turned off, a region of the frame portion, which is the non-display area 123 around the display area 122, looks brighter than the display area 122, resulting in a distinct difference between the display region 122 and the non-display area 123. This diminishes the visual quality and has been a problem.

Additionally, in the above, explanations were made mainly with reference to liquid crystal display devices as an example. However, the above-mentioned problem is not limited to the liquid crystal display devices but may occur similarly to any display device which uses a color filter forming substrate having a frame portion in a region not for display around a periphery of a region for display.

PRIOR ART DOCUMENTS

Patent Document

Patent Document 1: International Publication No. WO 2010/150668
Patent Document 2: Japanese Patent Laid-Open Publication No. 2009-053893

SUMMARY OF INVENTION

Problems to be Solved by the Invention

As described above, recently, the multifunctional terminals are spreading extensively and, especially, the tablet-type multifunctional terminals are also expected to spread rapidly. While liquid crystal display devices are being used as a display of these terminals, high display quality and good design characteristics are required for the display devices.

Under these circumstances, when, in a multifunctional terminal, a color filter forming substrate for a display device is being used as shown in FIG. 6A, the color filter forming substrate comprising a transparent substrate as a base material and, on one side of the base material, colored layers of respective colors for a color filter disposed in a region for display and a light-shielding colored layer referred to as a frame portion disposed as a region for not display around a periphery of the region for display, there has been a defect that, when display in the display area is turned off, the frame portion as a non-display area surrounding the display area looks brighter than the display area, resulting in a distinct difference between the display area and the non-display area, and poor visual quality. A countermeasure to this problem has been desired.

The present invention is intended to address this problem and tries to provide a color filter forming substrate of good visual quality by reducing the difference between the display area and the frame portion as the non-display area surrounding the display area, which difference arises when display is turned off when a color filter forming substrate for a display device is being used in a display device, in which the color filter forming substrate comprising a transparent substrate as a base material, and, on one side of the base material, colored layers of respective colors for a color filter disposed in a region for display and a light-shielding colored layer referred to as a frame portion disposed as a region not for display around a periphery of the region for display.

Means for Solving the Problems

The color filter forming substrate of the present invention comprises: a transparent substrate as a base material; and, on one side of the base material, colored layers of respective colors for a color filter disposed in a region for display and a light-shielding frame portion disposed as a region not for display around outside of the region for display; and the color filter forming substrate is used for a display device, wherein the frame portion has a reflection controlling layer and a light-shielding colored layer laminated in this order from the base material side.

Further, the present invention is the above-mentioned color filter forming substrate, wherein the above-mentioned reflection controlling layer is a colored layer and wherein the colored layer which is the above-mentioned reflection controlling layer comprises at least one of the colored layers of respective colors for the color filter.

Furthermore, herein, when the color filter forming substrate is used for a display device, the region which becomes a display area is referred to as a "region for display" and a region which does not become the display area is referred to as a "region not for display."

Also, the present invention is the color filter forming substrate according to any of the above-mentioned descriptions, wherein the reflection controlling layer comprises the same one colored layer disposed as a single layer.

Alternatively, the present invention is the color filter forming substrate according to any of the above-mentioned descriptions, wherein the reflection controlling layer comprises a plurality of different colored layers disposed in parallel as a single layer.

Further alternatively, the present invention is the color filter forming substrate according to any of the above-mentioned descriptions, wherein the reflection controlling layer comprises a plurality of different colored layers disposed as a laminate.

The method for manufacturing the color filter forming substrate of the present invention is a method for manufacturing a color filter forming substrate, the color filter forming substrate comprises: a transparent substrate as a base material; and, on one side of the base material, colored layers of respective colors for a color filter disposed in a region for display and a light-shielding frame portion disposed as a region not for display around outside of the region for display; the color filter forming substrate is used for a display device; the frame portion has a colored layer for a reflection controlling layer and a light-shielding colored layer laminated in this order from the base material side, wherein the colored layers of respective colors for the color filter, a light-shielding colored layer for a black matrix which separates the colored layers of respective colors, the colored layer which becomes the reflection controlling layer of the frame portion, and the light-shielding colored layer of the frame portion are each formed by one photolithography process; wherein the whole colored layer which becomes the reflection controlling layer of the frame portion is formed in at least one of respective photolithography processes for forming the colored layers of respective colors for the color filter; and wherein the light-shielding colored layer of the frame portion is formed on the whole colored layer which becomes the reflection controlling layer in the photolithography process for forming the light-shielding colored layer for the black matrix.

The display device of the present invention is a display device which uses a color filter forming substrate for a display device and comprises a transparent substrate as a base material; and, on one side of the base material, colored layers of respective colors for a color filter disposed in a region for display and a frame portion comprising a light-shielding colored layer disposed as a region not for display around a periphery of the region for display, wherein the color filter forming substrate according to any of the above-mentioned descriptions is used.

(Function)

Being constituted as described above, the color filter forming substrate of the present invention, when, in a display device, a frame portion is disposed surrounding the respective colored layers for the color filter of the color filter forming substrate used and a non-display area is formed by the frame portion around a whole boundary between the display area and a frame, makes it possible to provide a color filter forming substrate which shows, when display is turned off, only a small difference between the display area and the frame portion which is the non-display area surrounding the display area.

Especially, the present invention is effective for a display portion such as one in a multifunctional terminal, which requires high quality and good design characteristics.

Specifically, the present invention achieves the above-mentioned function by providing a color filter forming substrate comprising: a transparent substrate as a base material; and, on one side of the base material, colored layers of respective colors for a color filter disposed in a region for display and a light-shielding frame portion disposed as a region not for display around outside of the region for display, and the color filter forming substrate is used for a display device, wherein the frame portion has a reflection controlling layer and a light-shielding colored layer laminated in this order from the base material side.

That is, by having a reflection controlling layer disposed between the base material and the light-shielding colored layer which are placed in a direction perpendicular to the region for display, reflection of outside light on the light-shielding colored layer in the region not for display can be controlled.

The above-mentioned reflection controlling layer includes a colored layer and, especially when the colored layer which is the reflection controlling layer comprises at least one of the colored layers of respective colors for the color filter, the reflection controlling layer can be formed with the colored layer without increasing the number of processes in a usual manufacturing process of a color filter substrate.

Further, when the reflection controlling layer is formed with a colored layer for a color filter of the color filter forming substrate, there may be mentioned a first embodiment wherein the reflection controlling layer has the same one colored layer disposed as a single layer, a second embodiment wherein the reflection controlling layer has a plurality of different colored layers disposed in parallel as a single layer, and a third embodiment where the reflection controlling layer has a plurality of different colored layers disposed as a laminate. However, the present invention is not limited to these.

Effect of the Invention

As described above, when, in a display device, a frame portion is disposed surrounding the respective colored layers for the color filter of the color filter forming substrate used and a non-display area is formed by the frame portion around a whole boundary between the display area and a frame, the present invention makes it possible to provide a display device which shows, when the display is turned off, only a small difference between the display area and the frame portion which is the non-display area surrounding the display area.

BRIEF DESCRIPTION OF THE DRAWINGS

FIG. 2A is a plan view of the second example of the embodiments of the color filter forming substrate of the present invention; FIG. 2B and FIG. 2C are views taken in the direction of arrows along B1-B2 and B3-B4, respectively; FIG. 2D is an enlarged view of the B5 portion of FIG. 2A; and FIG. 2E is an enlarged view of the B6 portion of FIG. 2A.

FIG. 3E is an enlarged view of the C6 portion of FIG. 3A.

DESCRIPTION OF THE PREFERRED EMBODIMENTS

Figure 1A:
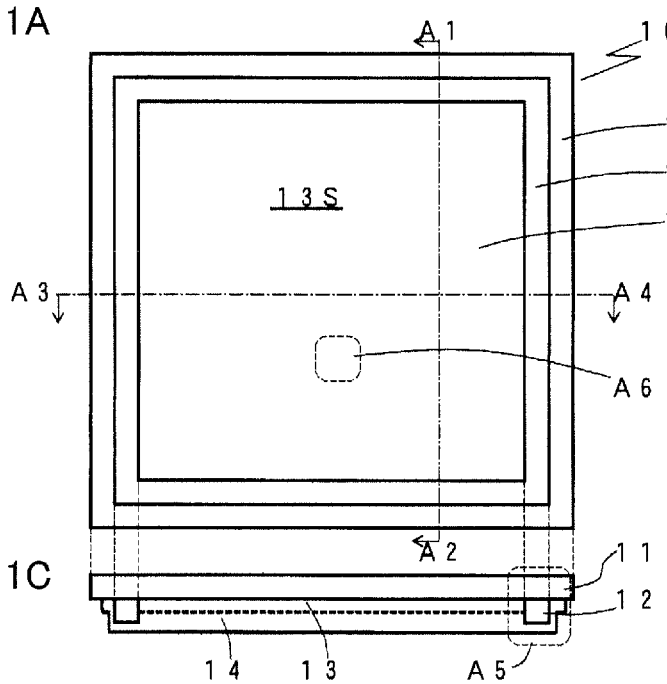
FIG. 1A is a plan view of the first example of the embodiments of the color filter forming substrate of the present invention.
Figure 1B:
FIG. 1B and FIG. 1C are views taken in the direction of arrows along A1-A2 and A3-A4, respectively.
Figure 1C:
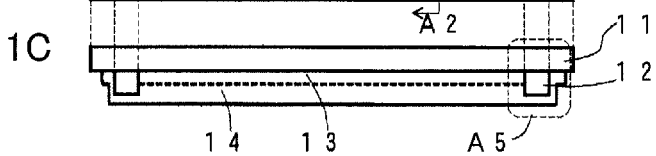

The color filter forming substrate of the present invention will be described. The color filter forming substrate of the present invention comprises: a transparent substrate as a base material; and, on one side of the base material, colored layers of respective colors for a color filter disposed in a region for display and a light-shielding frame portion disposed as a region not for display around outside of the region for display, and the color filter forming substrate is used for a display device, wherein the frame portion has a reflection controlling layer and a light-shielding colored layer laminated in this order from the base material side.

According to the present invention, in a display device, when a frame portion is disposed surrounding a periphery of respective colored layers for a color filter of the color filter forming substrate used and a non-display area is formed by the frame portion around a whole boundary between the display portion and a frame, and the frame portion being constituted by laminating a reflection controlling layer and a light-shielding colored layer in this order from the base material side, it becomes possible to provide a color filter forming substrate which shows only a small difference between the display area and the region of the frame portion which is a non-display area surrounding the display area when display is turned off.

Here, when a conventional color filter forming substrate is used for a display device, there is a problem that, when a power source (display) of the display device is turned off, a difference between the display area and the region of the frame portion which is a non-display area surrounding the display area, more specifically a phenomenon that the non-display area appears brighter than the display area, diminishes visual quality of the display device itself.

The present inventors conducted diligent research on reasons why such a problem arises and, as a result, found that the above-mentioned difference between the display area and the non-display area arises because reflectance of the frame portion comprising a light-shielding colored layer formed in the non-display area is higher than reflectance as an average (hereinafter, may sometimes be referred to as "color average") of the colored layers of respective colors for a color filter formed in the display area. Having acquired this knowledge, the present inventors further conducted research diligently and found that the problem could be solved by forming in the frame portion a reflection controlling layer between the base material and the light-shielding colored layer for the purposes of controlling reflectance-wavelength characteristics (reflectance spectroscopic characteristics) of the light-shielding colored layer and reducing the difference in reflection of outside light between the color average and the light-shielding colored layer. Based on this finding, the present invention was completed.

As mentioned above, the color filter forming substrate of the present invention can exhibit the above-mentioned effect due to the frame portion having the reflection controlling layer. Hereinafter, the reflection controlling layer will be described in more detail.

The reflection controlling layer in the present invention refers to a layer which is designed to control reflectance-wavelength characteristics (reflectance spectroscopic characteristics) of the light-shielding colored layer and to decrease the difference in reflection of outside light between the color average and the light-shielding colored layer.

Here, as a specific difference in reflection of outside light between the color average and the light-shielding colored layer, especially easily recognized is the difference between color average brightness of the reflected outside light (hereinafter, sometimes referred to as "color average brightness") in the display area and brightness of reflected outside light from the frame portion (hereinafter, referred to as "brightness of the frame portion") in the non-display area.

Therefore, the reflection controlling layer is not particularly limited as long as it can reduce reflectance of the light-shielding colored layer so that, at least, the difference between the color average brightness in the display area and the brightness of the frame portion in the non-display area can be decreased. More specifically, the above-mentioned reflection controlling layer is preferably one which can decrease reflectance of the light-shielding colored layer so that an absolute value of the above-mentioned difference ($\Delta Y$) in brightness (Y values) between the color average and the frame portion can be adjusted to 1.5 or less, above all 1 or less, and especially less than 1. This is so because, when the above-mentioned difference exceeds the above-mentioned range, there is a possibility that it becomes difficult to reduce parallax between the display area and the non-display area even when the reflection controlling layer is formed between the base material and the light-shielding colored layer.

In addition, the method for measuring color average brightness and brightness of the frame portion will be described later.

Furthermore, the above-mentioned difference between the display area and the non-display area is influenced not only by the above-mentioned difference in brightness between the color average in the display area and the frame portion in the non-display area but also by a difference in tint of the reflected light of the above-mentioned color average (hereinafter, may sometimes be referred to as "color average tint") and tint of the reflected light from the frame portion (hereinafter, sometimes referred to as the "tint of the frame portion"). Therefore, the reflection controlling layer in the present invention is more preferably one which can decrease the difference in brightness between the color average and the frame portion while also can decrease the above-mentioned difference in tint of the color average and the frame portion.

Specific tint of the reflection controlling layer is not particularly limited as long as the above-mentioned parallax between the display area and the non-display area can be decreased; more specifically, the above-mentioned difference in tint of the color average and the frame portion, namely absolute values of differences ($\Delta x$, $\Delta y$) of respective components of color coordinates (x, y) in the XYZ color coordinate system according to JIS 28701 can preferably be adjusted as follows: for $\Delta x$, 0.100 or less, above all 0.050 or less, and especially 0.020 or less; and for $\Delta y$, 0.100 or less, above all 0.050 or less, and especially 0.020 or less.

This is so because, when the absolute values of the differences of respective components of the above-mentioned color coordinates exceeds the above-mentioned range or when the above-mentioned difference is less than the above-mentioned range, there is a possibility that it becomes difficult to reduce parallax between the display area and the non-display area even when a reflection controlling layer is formed between the base material and the light-shielding colored layer.

In addition, the method for measuring the color coordinates of the color average and the color coordinates of the frame portion will be described later.

Such a reflection controlling layer as described above is not particularly limited as long as it can at least possess the above-mentioned brightness. However, it is preferably a colored layer, and especially, the colored layer, which is the reflection controlling layer, more preferably comprises at least one of the colored layers of respective colors for a color filter. This is so because, this way, it is possible to simplify a manufacturing process of a color filter forming substrate.

Also, the above-mentioned reflection controlling layer may be disposed separately by using a layer different from respective layers used for the color filter forming substrate.

When the reflection controlling layer is formed with the colored layers for a color filter of the color filter forming substrate, the reflection controlling layer may be one constituted by a colored layer of one color, one constituted by disposing a plurality of different colored layers in parallel as a single layer, or one constituted by disposing a plurality of different colored layers as a laminate. Above all, in the present invention, the reflection controlling layer is preferably one constituted by disposing a plurality of different colored layers in parallel as a single layer. By having the reflection controlling layer constituted as described above, it becomes possible to suitably adjust both brightness and tint of the color average in the display area, and those of the frame portion in the non-display area.

Hereinafter, embodiments of the color filter forming substrate of the present invention will be described with reference to three embodiments as examples. Specifically, there will be described a first embodiment wherein a reflection controlling layer is disposed as a single layer of the same one colored layer, a second embodiment wherein the reflection controlling layer is formed by disposing a plurality of different colored layers in parallel as a single layer, and a third embodiment where the reflection controlling layer is disposed as a laminate of a plurality of different colored layers.

First of all, the first example of embodiments of the color filter forming substrate of the present invention will be described based on FIGS. 1A to 1E.

The color filter forming substrate 10 of the first example comprises: a transparent substrate as a base material 11; and, on one side of the base material 11, colored layers (13R, 13G, and 13B) of respective colors for a color filter and a colored layer 13M for a black matrix in a region for display 13S and a light-shielding frame portion 12 as a region not for display around outside the region for display 13S; and the color filter forming substrate 10 is used for a display device, wherein the frame portion 12 has a reflection controlling layer 12a1 and a light-shielding colored layer 12b laminated in this order from the base material 11 side.

Further, a protective layer 14 (also referred to as "overcoat layer" or "OC layer") is disposed evenly so as to cover the colored layer 13 in the region for display 13S and the frame portion 12.

Here, the region for display 13S refers to a region which becomes a display area when used for a display device and means the region inside the frame portion 12 in FIG. 1A.

Further, a region of the frame portion 12 which does not become the display area is referred to as a region not for display.

Furthermore, the colored layer 13 refers collectively to the colored layers 13R, 13G, and 13B of respective colors for the color filter, and the colored layer 13M for the black matrix.

Figure 1D:
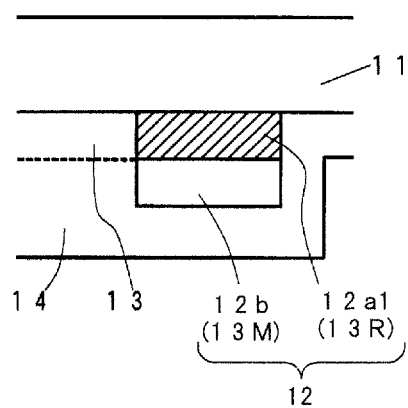
FIG. 1D is an enlarged view of the A5 portion of FIG. 1A.

In the first example, as shown in FIG. 1D, the reflection controlling layer 12a1 is formed as a single layer with the red colored layer 13R for the color filter. Meanwhile, the light-shielding colored layer 12b is formed as a single layer with the colored layer 13M for forming the black matrix.

The red colored layer 13R of the reflection controlling layer 12a1 is formed in a photolithography process when the red colored layer 13R in the region for display 13S is formed. Also, the light-shielding colored layer 12b on the reflection controlling layer 12a1 is formed in a photolithography process when the light-shielding colored layer 13M for the black matrix in the region for display 13S is formed.

Figure 1E:
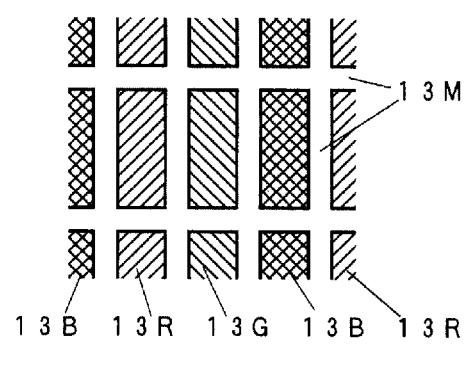
FIG. 1F is an enlarged view of the A6 portion of FIG. 1A.
Figure 3A:
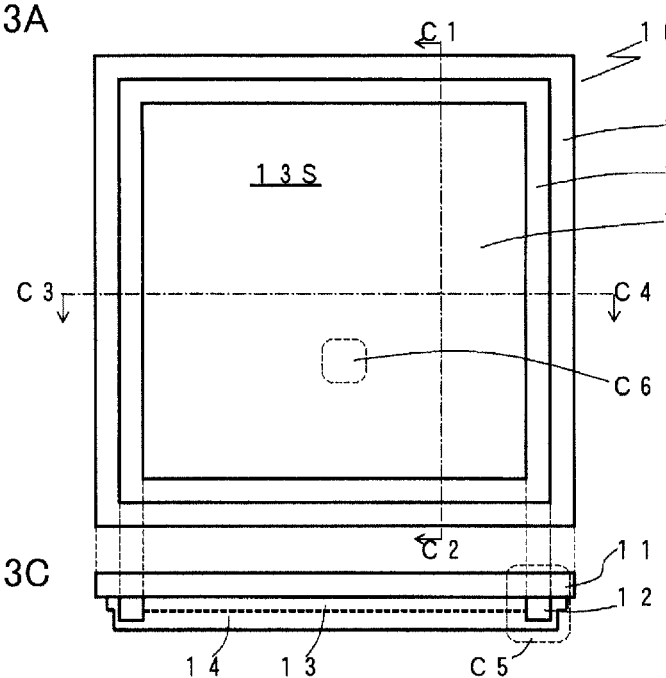
FIG. 3A is a plan view of the third example of the embodiments of the color filter forming substrate of the present invention.
Figure 3B:
FIG. 3B and FIG. 3C are views taken in the direction of arrows along C1-C2 and C3-C4, respectively.
Figure 3C:
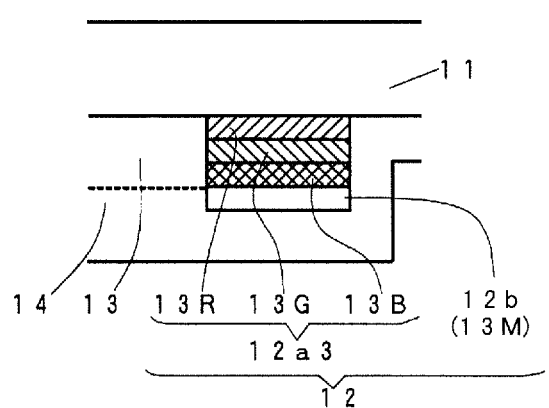
Figure 3D:
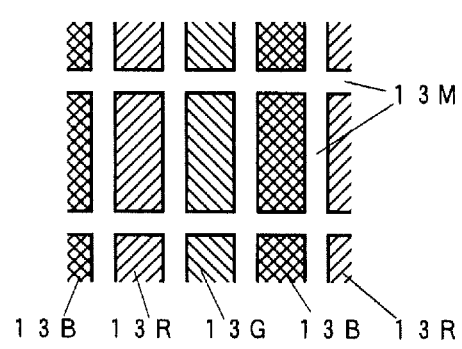
FIG. 3D is an enlarged view of the C5 portion of FIG. 3A.

Additionally, in the region for display, as shown in FIG. 1E, the colored layers 13R, 13G, and 13B of respective colors for the color filter are formed in a prescribed arrangement such that they are separated by the colored layer 13M for forming the black matrix.

The shape of an aperture pattern of the black matrix and the arrangement of the colored layers of respective colors are not limited to embodiments shown in FIG. 1E.

There may also be mentioned a black matrix in which the shape of an aperture pattern is striped or the arrangement of the colored layers is changed.

In the first example, by having a reflection controlling layer 12a1 disposed between the base material 11 and the light-shielding colored layer 12b which are arranged in a direction perpendicular to the region for display 13S, reflection of outside light on the light-shielding colored layer 12b in the region not for display can be controlled.

Next, materials for each part will be described.

<Base Material 11>

As the base material 11 comprising a transparent substrate used in the first example, there can be used those which have been conventionally used for the color filter forming substrate. Examples may be inflexible transparent inorganic substrates such as silica glass, Pyrex (registered trademark) glass and a synthetic silica board; and flexible transparent resin substrates such as a transparent resin film and an optical resin board. However, especially, it is preferable to use inorganic substrates and, among the inorganic substrates, it is preferable to use the glass substrates.

Furthermore, among the above-mentioned glass substrates, it is preferable to use a non-alkali type glass substrate.

This is so because the non-alkali type glass substrate is excellent in size stability and in workability at high temperature heating treatment and is free from any alkali component in the glass, making it possible to be used suitably for a color filter forming substrate for a color liquid crystal display device driven by an active matrix system.

As the above-mentioned base material, transparent substrates are usually used.

<Light-Shielding Colored Layer 13M for Black Matrix and Frame Portion>

The light-shielding colored layer in the present invention is not particularly limited as long as it can shield light which exits from the display device to the outside when the color filter forming substrate of the present invention is used for a display device. However, specifically, its OD (Optical Density) value is preferably 2.5 or more, above all 3.0 or more, and especially 4.0 or more. In addition, the upper limit thereof is about 5.0.

Meanwhile, the above-mentioned OD value can be obtained, for example, by using a method comprising measuring color by a spectrophotometric colorimeter and calculating the OD value from a Y value of separated light. As an example of the spectrophotometric colorimeter, there can be used a spectrophotometric colorimeter manufactured by Olympus Corporation.

As such a light-shielding colored layer as described above, a black one is usually used.

More specifically, the light-shielding colored layer 13M includes, for example, a composition which comprises a black colorant dispersed or dissolved in a binder resin.

The composition which comprises the black colorant dispersed or dissolved in the binder resin can be made relatively thick in film thickness.

The film thickness of the light-shielding colored layer 13M is set at about 0.5 μm to 2 μm when it is a composition which comprises the black colorant dispersed or dissolved in the binder resin.

When a photolithography method is used as a method to form the light-shielding colored layer 13M, there is used, as the binder resin, a photopolymer resin having a reactive vinyl group such as an acrylate type, a methacrylate type, a polyvinyl cinnamate type, a cyclized rubber type, and the like.

In this case, to the photopolymer resin composition comprising a black colorant and a photopolymer resin for forming a black matrix (light-shielding colored layer), there may be added a photopolymerization initiator, and if necessary, there may be further added a sensitizer, a coating property improver, a development improver, a crosslinking agent, a polymerization inhibitor, a plasticizer, a flame retardant, and the like.

In addition, when a printing method or an inkjet method is used as a method for forming the light-shielding colored layer 13M, the binder resin includes, for example, a polymethyl methacrylate resin, a polyacrylate resin, a polycarbonate resin, a polyvinyl alcohol resin, a polyvinyl pyrrolidone resin, a hydroxyethyl cellulose resin, a carboxymethyl cellulose resin, a polyvinyl chloride resin, a melamine resin, a phenol resin, an alkyd resin, an epoxy resin, a polyurethane resin, a polyester resin, a maleic acid resin, a polyamide resin and the like.

<Colored Layers 13R, 13G, and 13B>

In the present example, the colored layers of respective colors for the color filter comprise the colored layers of three colors, namely a red colored layer 13R, a green colored layer 13G, and a blue colored layer 13B.

The colored layers of respective colors are compositions having colorants such as pigments and dyes which are dispersed or dissolved in binder resins and are formed by a photolithography method.

As the binder resin for the above-mentioned colored layers, there is used a photopolymer resin having a reactive vinyl group such as an acrylate type, a methacrylate type, a polyvinyl cinnamate type and a cyclized rubber type.

In this case, to the photopolymer resin composition comprising a colorant and a photopolymer resin for forming the colored layer, there may be added a photopolymerization initiator, and if necessary, there may be further added a sensitizer, a coating property improver, a development improver, a crosslinking agent, a polymerization inhibitor, a plasticizer, a flame retardant, and the like.

The film thickness of the above-mentioned colored layers of respective colors is usually set in a range of about 1 μm to 5 μm.

The colors of the colored layers are not particularly limited as long as they include at least three colors of red, green, and blue. For example, the colors may include three colors of red, green, and blue; four colors of red, green, blue, and yellow; and five colors of red, green, blue, yellow, and cyan.

Further, the colorant used for the red (also described as R) colored layer includes, for example, perylene-type pigments, lake pigments, azo-type pigments, quinacridone-type pigments, anthraquinone-type pigments, anthracene-type pigments, and isoindoline-type pigments.

These pigments may be used alone or as a mixture of two or more thereof.

The colorant used for the green (also described as G) colored layer includes, for example, phthalocyanine-type pigments such as polyhalogenated phthalocyanine-type pigments or polyhalogenated copper phthalocyanine-type pigments; triphenylmethane-type basic dyes; and isoindoline-type pigments; isoindolinone-type pigments.

These pigments and dyes may be used alone or as a mixture of two or more thereof.

The colorant used for the blue (also described as B) colored layer includes, for example, copper phthalocyanine-type pigments, anthraquinone-type pigments, indanthrene-type pigments, indophenol-type pigments, cyanine-type pigments, and dioxazine-type pigments.

These pigments may be used alone or as a mixture of two or more thereof.

<Protective Layer 14>

The material for the protective layer includes a thermosetting resin composition and a photocurable resin composition.

The photocurable resin composition is preferable for cutting a color filter forming substrate into respective pieces after imposition and fabrication.

As the photocurable resin composition for the protective layer, there is used one similar to the above-mentioned binder resins used for the colored layers of respective colors for the color filter such as a photopolymer having a reactive vinyl group of an acrylate type, a methacrylate type, a polyvinyl cinnamate type, or a cyclized rubber type.

In this case also, there may be added, to the photopolymer resin composition for forming the protective layer comprising a photopolymer, a photopolymerization initiator and if necessary, there may be further added a sensitizer, a coating property improver, a development improver, a crosslinking agent, a polymerization inhibitor, a plasticizer, a flame retardant, and the like.

In the first example, the color filter forming substrate is coated with the resin composition by a spin coating method after imposition and formation of respective colored layers 13R, 13G, 13B, 13M, and the frame portion 12. Hereat, a cut is formed on the protective layer between each color filter forming substrate and the substrate is separated into individual pieces at the cut. For this purpose, the resin composition for the protective layer prepared as a photocurable resin composition is coated and thereafter dried. This is followed by selective photo-irradiation of a prescribed region only and development to form the protective layer. However, the method for forming the protective layer is not limited to this.

The thermosetting resin composition for the protective layer includes one using an epoxy compound and one using a thermal radical generator.

The epoxy compound includes heretofore known polyvalent epoxy compounds which can be cured by carboxylic acids, amine-type compounds, and the like. Such epoxy compounds are widely disclosed in, for example, Masaki Simpo Ed., "Epoxy Resin Handbook," Nikkan Kogyo Shinbun, Ltd. (1987) and the like, and it is possible to use these compounds.

The thermal radical generator is at least one selected from the group consisting of persulfate salts, halogens such as iodine, azo compounds, and organic peroxides; and, azo compounds or organic peroxides are more preferable.

The azo compounds includes 1,1'-azobis(cyclohexane-1-carbonitrile), 1-[(1-cyano-1-methylethyl)azo]formamide, 2,2'-azobis[N-(2-propenyl)-2-methylpropionamide], 2,2'-azobis(N-butyl-2-methylpropionamide), and 2,2'-azobis(N-cyclohexyl-2-methylpropionamide), and the like. The organic peroxides include di(4-methylbenzoyl)peroxide, t-butylperoxy-2-ethyl hexanate, 1,1-di(t-hexylperoxy)cyclohexane, 1,1-di(t-butylperoxy)cyclohexane, t-butylperoxy benzoate, t-butylperoxy-2-ethylhexyl monocarbonate, t-butyl-4,4-di(t-butylperoxy)butanate, dicumyl peroxide, and the like.

Further, the reflection controlling layer 12a1 will be described.

By using curable resin compositions of respective colors mentioned in Example 1, the colored layers of respective colors 13R, 13G, 13B, and 13M were formed by a photolithography method in the same manner as in Example. When reflectance of each layer and the base material was measured, reflectance-wavelength characteristics (reflectance spectroscopic characteristics) were obtained as shown in FIG. 4A.

Figure 4A:
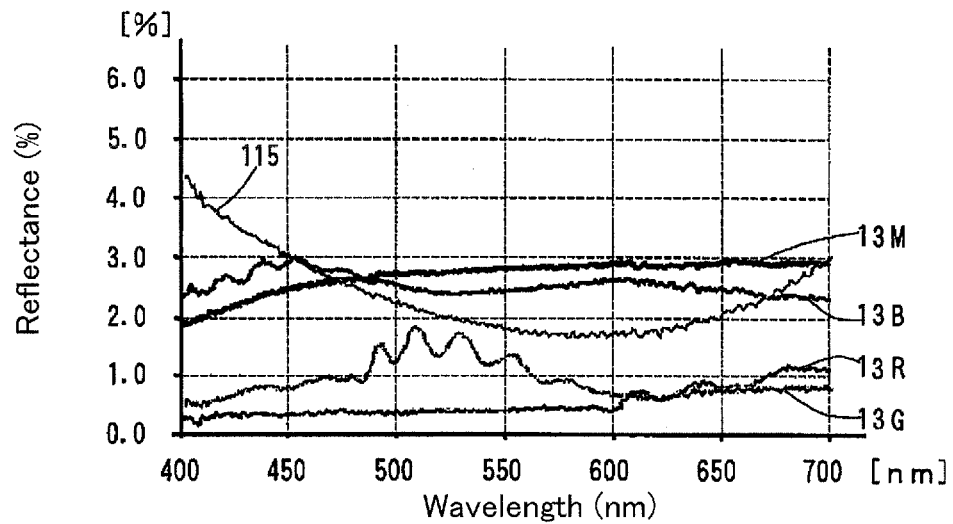
FIG. 4A is a figure showing reflectance of respective colored layers in a visible region (wavelength range of 400 nm to 700 nm)
Figure 4B:
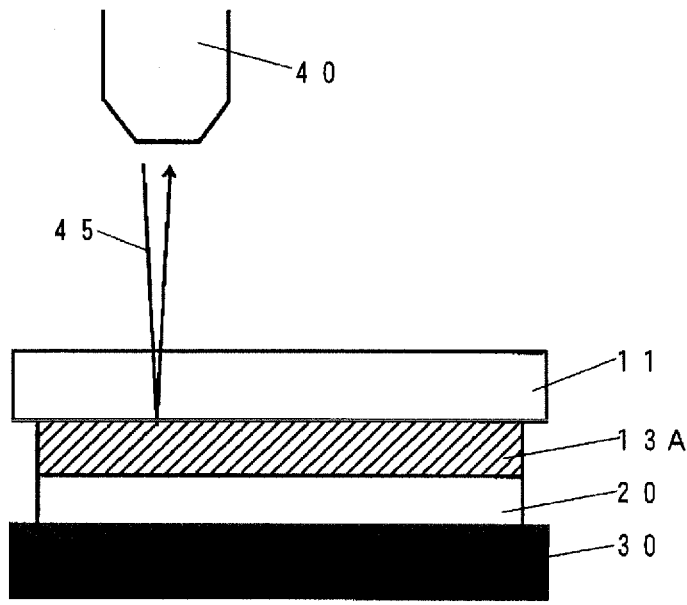
FIG. 4B is a schematic view showing a method of measuring reflectance.

Further, the graphs 13R, 13G, 13B, 13M, and 115 in FIG. 4A show the reflectance-wavelength characteristics (reflectance spectroscopic characteristics) of the red colored layer, the green colored layer, the blue colored layer, the light-shielding colored layer for the black matrix, and the base material, respectively. Measurement of the reflectance was carried out as shown in FIG. 4B by using a microspectro device OSP-SP2000™ (manufactured by Olympus Corporation).

First, a colored layer 13A for measurement is formed on a base material 11 for measurement, followed by fabrication of a color filter forming substrate for measurement having the colored layer 13A for measurement and a black plate 30 for measurement disposed with an oil 20 for refractive index adjustment interposed therebetween. Then, reflectance was measured by irradiating the base material side of the color filter forming substrate for measurement with inspection light 45 and detecting reflected light of the inspection light 45 by a detector 40.

Furthermore, the reflectance 115 of the base material can be measured by using a test piece prepared by disposing the base material for measurement on a black plate for measurement with the oil for refractive index adjustment interposed therebetween.

And when the measured reflectance-wavelength data were represented in terms of chromaticity coordinates (x, y) and brightness Y in the XYZ color coordinate system according to JIS 28701 as measured by using illuminant C, the results came out as shown in Table 1.

The color-average chromaticity coordinates (x, y) and brightness Y of reflected light from respective colored layers 13R, 13G, and 13B for the color filter are (0.306, 0.321) and 1.36, respectively.

Figure 5:
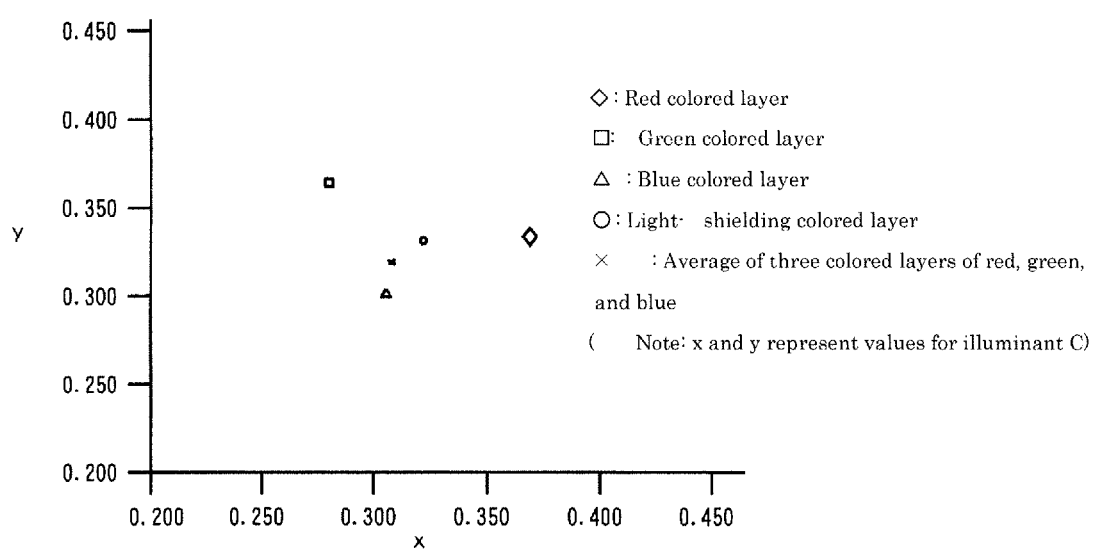
FIG. 5 is a figure showing reflected light from respective colored layers in an x-y representation of a CIE chromaticity diagram, as measured with illuminant C.
Figure 6A:
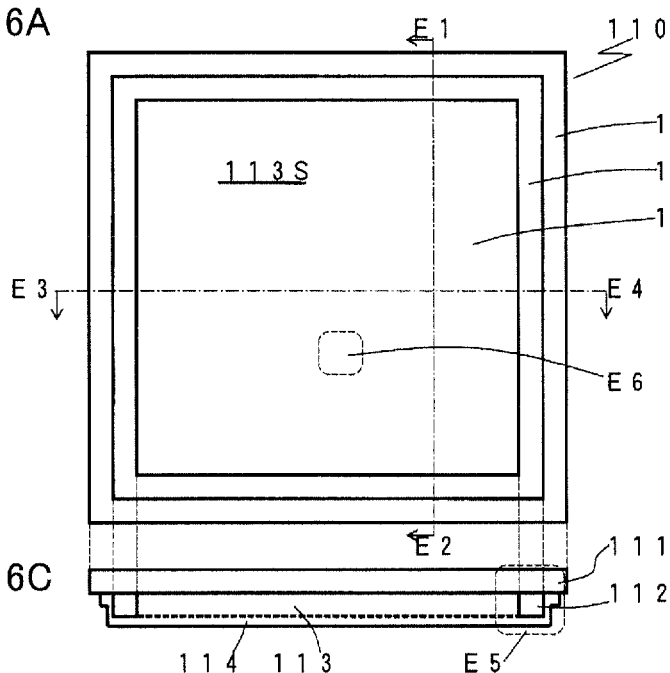
FIG. 6A is a plan view of a conventional color filter forming substrate.
Figure 6B:
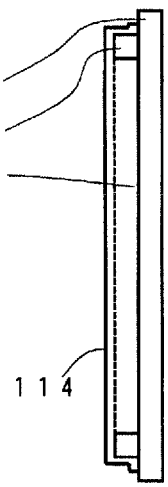
FIG. 6B and FIG. 6C are views taken in the direction of arrows along E1-E2 and E3-E4, respectively.
Figure 6C:
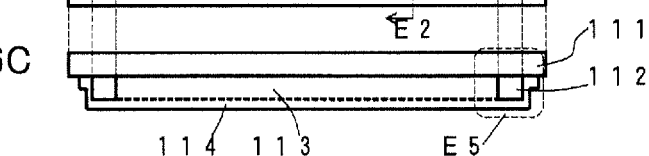
Figure 6D:
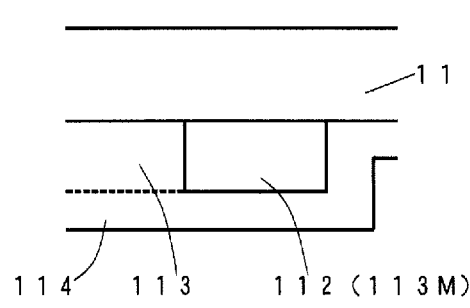
FIG. 6D is an enlarged view of the E5 portion of FIG. 6A.
Figure 6E:
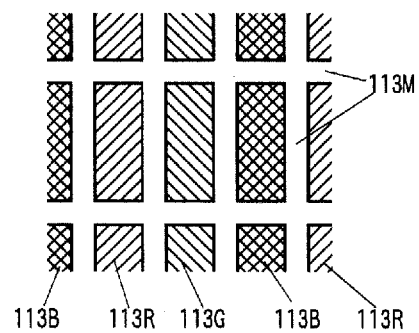
FIG. 6E is an enlarged view of the E6 portion of FIG. 6A.
Figure 7:
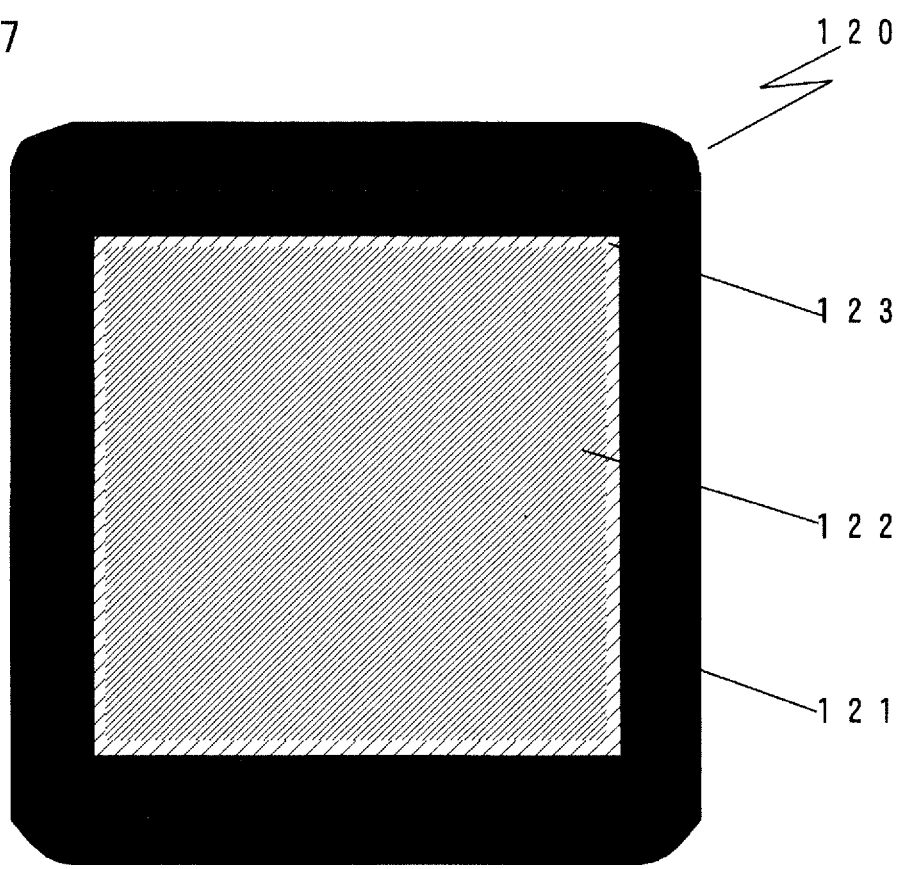
FIG. 7 is a plan view of a tablet-type multifunctional terminal using the color filter forming substrate shown in FIGS. 6A to 6E.

And when the chromaticity coordinates (x, y) in the XYZ color coordinate system according to JIS 28701 as measured by using illuminant C are calculated based on the measured reflection-wavelength data, the results become as shown in FIG. 5.

The point marked "x" in the graph of FIG. 5 shows chromaticity (x, y) of a color obtained by averaging reflected lights from the colored layers of respective colors of red, green, and blue for a color filter.

From the above, when the above-mentioned colored layers are used in the first example, it can be seen that the chromatic coordinates (x, y) and the brightness Y of the color average in the region for display, where the respective colored layers 13R, 13G, and 13B for a color filter are formed, become approximately (0.306, 0.321) and 1.36, respectively.

In addition, the chromaticity coordinates (x, y) and the brightness Y of the light-shielding colored layer 12b in the frame portion 12 become (0.323, 0.333) and 2.79, respectively.

Therefore, when respective colored layers similar to those in Example are used and if the brightness Y in the frame portion 12 is lowered so that it becomes closer to 1.36, the above-mentioned color-average brightness, the difference in reflection of outside light between the above-mentioned color average and the light-shielding colored layer 12b becomes smaller.

Based on these findings, it is the reflection controlling layer 12a1 which was disposed in order to control the reflectance-wavelength characteristics of the light-shielding colored layer 12b and reduce the difference in reflection of outside light between the above-mentioned color average and the light-shielding colored layer 12b.

Here, the reflection controlling layer 12a1 means a layer for controlling the reflectance-wavelength characteristics (reflectance spectroscopic characteristics) of the light-shielding colored layer 12b and reducing the difference in reflection of outside light between the above-mentioned color average and the light-shielding colored layer 12b.

TABLE 1

|  | x | y | Y |
|---|---|---|---|
| (1) Red colored layer | 0.369 | 0.335 | 0.46 |
| (2) Green colored layer | 0.280 | 0.367 | 1.12 |
| (3) Blue colored layer | 0.305 | 0.301 | 2.49 |
| (4) Color average of the red, green, and blue colored layers | 0.306 | 0.321 | 1.36 |
| (5) Light-shielding colored layer | 0.323 | 0.333 | 2.79 |

On the other hand, it can be seen from Table 1 that the brightness Y of the red colored layer 13R is as small as 0.46.

The present inventors paid attention to this and envisioned that, when the frame portion is formed (see FIGS. 1A to 1E) by laminating the light-shielding colored layer 12b and the red colored layer 13R from the side of the base material 11, the reflectance of the frame portion might be reduced compared to the conventional case (see FIGS. 6A to 6E) where the frame portion comprises a single layer of the light-shielding colored layer 12b. In fact, when the red colored layer 13R and the light-shielding colored layer 12b were laminated in this order from the side of the base material 11, reflectance-wavelength data thereof showed that the brightness Y was about 2.0, making it clear that the red colored layer 13R is effective as the reflection controlling layer.

Based on these findings, the first example has the red colored layer 13R disposed between the light-shielding colored layer 12b and the base material 11 as the reflection controlling layer.

In addition, in the first example, the red colored layer 13R in the region for display 13S and the red colored layer 13R between the light-shielding colored layer 12b and the base material 11 in the frame portion 12 are formed by the same one photolithography process. Thus, the color filter forming substrate can be fabricated with the same number of processes as in the conventional case (see FIGS. 6A to 6E) in which the reflection controlling layer is not disposed.

Further, the colored layer used as the reflection controlling layer is not particularly limited as long as it is one which is used as the colored layer for the color filter in the region for display, and it is possible to use any of three colored layers of red, green and blue, or, when four or more colored layers are used, any one colored layer chosen from the four or more colored layers. In the present invention, from the standpoint of reducing the difference in tint between the color average in the display area and the frame portion in the non-display area, it is preferable to use the blue colored layer as the above-mentioned reflection controlling layer.

When a conventional color filter forming substrate is used for a display device, there is a problem that tint of a non-display area having a frame portion constituted only of a light-shielding colored layer tends to take on a yellowish color compared to the tint of a display area. Therefore, by using a blue colored layer as a reflection controlling layer, it becomes possible to suppress a trouble that the tint of the non-display area takes on a yellowish color and reduce a difference in tint between the display area and the non-display area.

Next, a second example of embodiments of the color filter forming substrate of the present invention will be described based on FIGS. 2A to 2E.

As in the first example, the color filter forming substrate 10 of the second example also comprises: a transparent substrate as a base material 11; and, on one side of the base material 11, colored layers (13R, 13G, and 13B) of respective colors for a color filter and a colored layer 13M for a black matrix in region for a display 13S and a light-shielding frame portion 12 as a region not for display around outside of the region for display 13S; and the color filter forming substrate 10 is used for a display device, wherein the frame portion 12 has a reflection controlling layer 12a2 and a light-shielding colored layer 12b laminated in this order from the base material 11 side.

Further, a protective layer 14 (also referred to as "overcoat layer" or "OC layer") is disposed evenly so as to cover the colored layer 13 (collective term for the respective colored layers 13R, 13B, and 13B for the color filter and the colored layer 13M for the black matrix) in the region for display 13S and the frame portion 12.

In the second example, as is shown in FIG. 2D, the reflection controlling layer 12a2 is formed by disposing three different colored layers 13R, 13G, and 13B in parallel as a single layer.

In the second example, the colored layers 13R, 13G, and 13B of respective colors for the reflection controlling layer 12a2 are respectively formed in photolithography processes for forming the colored layers 13R, 13G, and 13B of respective colors in the region for display 13S. Also, the light-shielding colored layer 12b of the reflection controlling layer 12a2 is formed in a photolithography process when forming the light-shielding colored layer 13M for the black matrix in the region for display 13S.

In addition, effectiveness of the second example in controlling the above-mentioned reflection of outside light is sometimes inferior to the first example.

Except the above-mentioned reflection controlling layer 12a2, respective parts are the same as in the first example and explanations thereof will be omitted here.

In the second example, the red colored layer 13R, the green colored layer 13G, and the blue colored layer 13B of the reflection controlling layer 12a2 are respectively formed in the photolithography processes of the red colored layer 13R, the green colored layer 13G, and the blue colored layer 13B in the region for display 13S. Thus, the color filter forming substrate can be prepared by the same number of processes as in the conventional case (see FIGS. 6A to 6E) in which the reflection controlling layer is not disposed.

In the second example also, by having the reflection controlling layer 12a2 disposed between the base material 11 and the light-shielding colored layer 12b which are arranged in a direction perpendicular to the region for display 13S, reflection of outside light on the light-shielding colored layer in the region not for display can be controlled.

The reflection controlling layer in the second example is not particularly limited as long as it is constituted by disposing colored layers of three colors of red, green, and blue in parallel, and line widths of respective colored layers and pitch (the width of the colored layers of three colors, which includes the width of spaces when the spaces are disposed between the colored layers) can suitably be selected depending on the intended use of the colored filter. Disposition of the colored layers constituting the reflection controlling layer may be the same as or different from disposition of the colored layers for the color filter formed in the region for display. Also, the boundaries of the respective colored layers may be partly overlapping or the respective colored layers may be disposed in parallel with prescribed spaces therebetween.

In the second example, from the standpoint of making smaller the difference in tint between the color average in the region for display and the frame portion in the region not for display, the line widths and the pitch of the colored layers of respective colors of the reflection controlling layer are preferably equivalent to the line width and the pitch of the colored layers for the color filter formed in the region for display. Also, in this case, it is more preferable that a light-shielding colored layer is formed between the respective colored layers in the reflection controlling layer. This can make the above-mentioned difference in tint between the color average and the frame portion even smaller.

On the other hand, in the reflection controlling layer in the second example, the difference in brightness between the color average in the region for display and the frame portion in the region not for display can be made even smaller by controlling the line widths of the colored layers.

Here, as shown in the above-mentioned FIG. 4A, the blue colored layer tends to show higher reflectance compared to the red colored layer and the green colored layer. Therefore, for example, when a color filter forming substrate of the present invention is manufactured by way of trial and if brightness of the above-mentioned color average is brighter than that of the above-mentioned frame portion, the brightness (Y value) of the frame portion can be increased by increasing the line width, an area ratio, and the like of the blue colored layer in the reflection controlling layer. Thus, the difference in brightness between the color average and the frame portion can be made smaller. On the other hand, when brightness of the color average is darker than that of the frame portion, the brightness (Y value) of the frame portion can be reduced by making smaller the line width, the area ratio, and the like of the blue colored layer in the reflection controlling layer. Thus, the difference in brightness between the color average and the frame portion can be made smaller.

Next, a third example of embodiments of the color filter forming substrate of the present invention will be described based on FIGS. 3A to 3E.

As is the case in the first example and the second example, the color filter forming substrate of the third example also comprises: a transparent substrate as a base material 11; and, on one side of the base material 11, colored layers (13R, 13G, and 13B) of respective colors for a color filter and a colored layer 13M for a black matrix in a region for display 13S and a light-shielding frame portion 12 as a region not for display around outside of the region for display 13S; and the color filter forming substrate 10 is used for a display device, wherein the frame portion 12 has a reflection controlling layer 12a3 and a light-shielding colored layer 12b laminated in this order from the base material 11 side.

Further, a protective layer 14 (also referred to as "overcoat layer" or "OC layer") is disposed evenly so as to cover the colored layer 13 (collective term for the colored layers (13R, 13G, and 13B) of respective colors for the color filter and the colored layer 13M for the black matrix) in the region for display 13S and the frame portion 12.

In the third example, the reflection controlling layer 12a3 is formed by disposing three different colored layers 13R, 13G, and 13B as a laminate.

In the third example, the colored layers 13R, 13G, and 13B of respective colors for the reflection controlling layer 12a3 are respectively formed in the photolithography processes when forming the colored layers 13R, 13G, and 13B of respective colors in the region for display 13S. Also, the light-shielding colored layer 12b of the reflection controlling layer 12a3 is formed in the photolithography process when forming the light-shielding colored layer 13M for the black matrix in the region for display 13S.

Except the above-mentioned reflection controlling layer 12a3, respective parts are the same as in the first example and explanations thereof will be omitted here.

Furthermore, in the third example also, the red colored layer 13R, the green colored layer 13G, and the blue colored layer 13B of the reflection controlling layer 12a3 are respectively formed in the photolithography processes of the red colored layer 13R, the green colored layer 13G, and the blue colored layer 13B in the region for display 13S. Thus, the color filter forming substrate can be prepared by the same number of processes as in the conventional case (see FIGS. 6A to 6E) in which the reflection controlling layer is not disposed.

In the third example also, by having the reflection controlling layer 12a3 disposed between the base material 11 and the light-shielding colored layer 12b which are arranged in a direction perpendicular to the region for display 13S, reflection of outside light on the light-shielding colored layer in the region not for display can be controlled.

The present invention is not limited to the above-mentioned embodiments.

For example, in each of the above-mentioned first example to the third example, there may also be mentioned an embodiment wherein a plurality of spacers of prescribed height are further disposed in the region for display on the protective layer 14.

In addition, a liquid crystal display device has a structure where a color filter forming substrate having a black matrix layer comprising a light-shielding colored layer and colored layers of respective colors disposed on one side of a transparent substrate, and a counter electrode substrate (also referred to as "TFT substrate") are disposed opposite to each other with a prescribed space therebetween and having a liquid crystal encapsulated in the space. Control of light transmittance of pixels of the colored layers of respective colors is performed by electrically controlling orientation of the liquid crystal and, in order to control the space between the color filter forming substrate and the counter electrode substrate (also referred to as "TFT substrate") at a prescribed value, the liquid crystal display device has a configuration where a plurality of spacers of prescribed height are disposed on the protective layer 14 of the color filter forming substrate.

Further, in each of the above-mentioned first example to the third example, colored layers for the color filter as the reflection controlling layer are used, but the colored layers for the reflection controlling layer is not limited to these.

Furthermore, although colored layers are mentioned as the reflection controlling layer, the reflection controlling layer is not limited to the colored layers.

The reflection controlling layer is not limited to the colored layers as long as it has a function as a reflection controlling layer and is applicable to a display device in terms of quality.

Meanwhile, the display device of the present invention is not particularly limited as long as it has the color filter forming substrate mentioned above and includes, for example, an electroluminescence display device and the like, in addition to the above-mentioned liquid crystal display.

The present invention is not limited to the above-mentioned embodiments. The above-mentioned embodiments are exemplifications, and any examples that have substantially the same constitution and demonstrate the same functions and effects as the technical concept described in claims of the present invention are included in the technical scope of the present invention.

EXAMPLES

The present invention will be further described with reference to Examples.

Example 1

Example 1 is preparation according to the first example of embodiments shown in FIGS. 1A to 1E, comprising steps of, as described below, preparing a photocurable curable resin composition A; preparing, by using the curable resin composition A prepared, a red curable resin composition, a green curable resin composition, and a blue curable resin composition for forming a color filter, and curable resin compositions for forming a black matrix and a frame portion; and carrying out, by using these, photolithography processes for respective curable resin compositions to form respective colored layers for a color filter, and colored layers for the black matrix and the frame portion.

Here, after forming a red colored layer 13R for the color filter in the region for display 13S and a red colored layer 13R which becomes a reflection controlling layer 12a of the frame portion 12 by the same one photolithography process, a green colored layer 13G and a blue colored layer 13B for the color filter were each independently formed by one photolithography process and, thereafter, a light-shielding colored layer 13M for the black matrix and the frame portion was formed.

(Preparation of Curable Resin Composition A)

A polymerization tank was charged with 63 weight parts of methyl methacrylate (MMA), 12 weight parts of acrylic acid (AA), 6 weight parts of 2-hydroxyethyl methacrylate (HEMA), and 88 weight parts of diethyleneglycol dimethyl ether (DMDG). After stirring and dissolving the mixture, 7 weight parts of 2,2'-azobis(2-methylbutyronitrile) were added and dissolved homogeneously.

Thereafter, under a nitrogen flow, the mixture was stirred at 85° C. for 2 hours and reacted further at 100° C. for 1 hour.

To the solution obtained was further added 7 weight parts of glycidyl methacrylate (GMA), 0.4 weight part of triethylamine, and 0.2 weight part of hydroquinone, and the mixture was stirred at 100° C. for 5 hours to obtain a copolymer resin solution (solid content, 50%).

Next, the following materials were stirred and mixed at room temperature to obtain a curable resin composition.

<Composition of Curable Resin Composition>

The above-mentioned copolymer resin solution (solid content, 50%): 16 weight parts Dipentaerythritol pentaacrylate (Sartomer Company Inc., SR399™): 24 weight parts Orthocresol-novolac-type epoxy resin (Japan Epoxy Resins Co., Ltd., Epicoat 180S70™): 4 weight parts 2-Methyl-1-(4-methylthiophenyl)-2-morpholinopropan-1-one: 4 weight parts Diethylene glycol dimethyl ether: 52 weight parts <Formation of Red Colored Layer 13R>

On a glass substrate (AN Material manufactured by Asahi Glass Co., Ltd) (substrate), a red curable resin composition of the following composition was coated by a spin coating method and, subsequently, dried in an oven of 70° C. for 3 minutes.

Then, a photomask was placed at a distance of 100 μm from the coated film of the red curable resin composition and, by using a proximity aligner, ultraviolet light was irradiated for 10 seconds only on a region corresponding to a colored layer forming region by means of a 2.0 kw ultra-high pressure mercury lamp.

Subsequently, the substrate was immersed in a 0.05 wt % aqueous potassium hydroxide solution (liquid temperature, 23° C.) for 1 minute to perform alkali development, whereby only an uncured portion of the coated film of the red curable resin composition was removed.

Thereafter, the substrate was subjected to a heat treatment by being allowed to stand in an atmosphere of 230° C. for 15 minutes to form a pattern consisting of a red colored layer 13 in a region for display 13S and all over a frame portion forming region which becomes a region not for display.

The thickness of the formed film became 2.0 μm.

<Composition of Red Curable Resin Composition>

C.I. Pigment Red 177: 3 weight parts

C.I. Pigment Red 254: 4 weight parts

Polysulfonic acid-type polymeric dispersant: 3 weight parts

Curable resin composition A: 23 weight parts

3-Methoxybutyl acetate: 67 weight parts

<Formation of Green Colored Layer 13G>

Then, by using a green curable resin composition of the following composition, a relief pattern consisting of a green colored layer was formed in a region for display by a process similar to the formation of the red relief pattern with the thickness of the formed film being adjusted to 2.0 μm.

<Composition of Green Curable Resin Composition>

C.I. Pigment Green 58: 7 weight parts

C.I. Pigment Yellow 138: 1 weight part

Polysulfonic acid-type polymeric dispersant: 3 weight parts

Curable resin composition A: 22 weight parts

3-Methoxybutyl acetate: 67 weight parts (Formation of Blue Colored Layer 13B)

Further, using a blue curable resin composition of the following composition, a blue relief pattern was formed in the region for display by a process similar to the formation of the red relief pattern with the thickness of the formed film being adjusted to 2.0 μm.

<Composition of Blue Curable Resin Composition>

C.I. Pigment Blue 15:6: 5 weight parts

Polysulfonic acid-type polymeric dispersant: 3 weight parts

Curable resin composition A: 25 weight parts

3-Methoxybutyl acetate: 67 weight parts (Formation of Light-Shielding Colored Layer 13M for Black Matrix and Frame Portion)

First, components of the following amounts were mixed and the mixture was dispersed thoroughly by means of a sand mill to prepare a black pigment dispersion.

<Composition of Black Pigment Dispersion>
- Black pigment: 23 weight parts
- Polymeric dispersant (BYK-Chemie Japan KK, Disperbyk 111™): 2 weight parts
- Solvent (diethylene glycol dimethyl ether): 75 weight parts Then, components of the following amounts were mixed thoroughly to obtain a light-shielding colored layer composition.

<Composition of Light-Shielding Colored Layer Composition>
- Above-mentioned black pigment dispersion: 60 weight parts
- Curable resin composition A: 20 weight parts
- Diethylene glycol dimethyl ether: 30 weight parts On a substrate having colored layers formed thereon, the above-mentioned light-shielding colored layer composition was coated by a spin coater and was dried at 100° C. for 3 minutes to form a light-shielding colored layer.

The light-shielding colored layer was exposed to a light-shielding pattern using an ultra-high pressure mercury lamp. Subsequently, the substrate was developed with a 0.05 wt % aqueous potassium hydroxide solution and, thereafter, the substrate was subjected to a heat treatment by being allowed to stand in an atmosphere of 230° C. for 30 minutes to form a light-shielding colored layer 13M on the region for display and the frame portion 12.

Here, the light-shielding colored layer was formed all over the red pattern in the region of the frame portion 12.

The thickness of the formed film after the heat treatment became 1.0 μm.

(Formation of Protective Layer 14)

On a substrate having the colored layer 13 formed as described above, the afore-mentioned curable resin composition A was coated by a spin coating method and dried to form a coated film of a dried thickness of 2 μm.

A photomask was placed at a distance of 100 μm from the coated film of the curable resin composition A and, by using a proximity aligner, ultraviolet light was irradiated for 10 seconds only on a region corresponding to a protective layer forming region by means of a 2.0 kw ultra-high pressure mercury lamp.

Subsequently, the substrate was immersed in a 0.05 wt % aqueous potassium hydroxide solution (liquid temperature, 23° C.) for 1 minute to perform alkali development, whereby only an uncured portion of the coated film of the curable resin composition was removed.

Thereafter, the substrate was subjected to a heat treatment by being allowed to stand in an atmosphere of 230° C. for 15 minutes to form a protective layer.

In this way, the color filter forming substrate 10 of the first example shown in FIGS. 1A to 15 was prepared.

Then, spacers of prescribed height were disposed in the following way on the protective layer 14 of the prepared color filter forming substrate 10 of the first example and a liquid crystal display device was fabricated.

(Formation of Spacers)

On the protective layer 14 of the color filter forming substrate 10 having the colored layers and the protective layer formed as described above, the curable resin composition A was coated by a spin coating method and dried to form a coated film.

A photomask was placed at a distance of 100 μm from the coated film of the curable resin composition A and, by using a proximity aligner, ultraviolet light was irradiated for 10 seconds only on a region corresponding to the spacer forming region by means a 2.0 kw ultra-high pressure mercury lamp.

Subsequently, the substrate was immersed in a 0.05 wt % aqueous potassium hydroxide solution (liquid temperature, 23° C.) for 1 minute to perform alkali development, whereby only an uncured portion of the coated film of the curable resin composition A was removed.

Thereafter, the substrate was subjected to a heat treatment by being allowed to stand in an atmosphere of 230° C. for 30 minutes so as to form spacers of prescribed number density.

(Fabrication of Liquid Crystal Display Device)

On the surface of the colored layer formed side of the color filter forming substrate obtained as described above, an oriented film (SE-6210™ manufactured by Nissan Chemical Industries, Ltd.) was formed.

Subsequently, a necessary amount of IPS liquid crystal was dropped onto a glass substrate (TFT substrate) on which TFTs had been formed, and the above-mentioned color filter was superposed. Using a UV curable resin (Three Bond 3025™ manufactured by ThreeBond Co., Ltd.) as a sealing material, exposure was carried out with an irradiance level of 400 mJ/cm$^2$ while applying a pressure of 0.3 kgf/cm$^2$ at room temperature to join the glass substrate and the color filter to form a cell, and polarizing plates, a backlight unit, and a cover were placed to obtain a liquid crystal display device.

Example 2

Except that the red colored layer 13R of the frame portion 12 in Example 1 was changed to a green colored layer 13G, a liquid crystal display device was fabricated in the same manner as in Example 1.

Example 3

Except that the red colored layer 13R of the frame portion 12 in Example 1 was changed to a blue colored layer 13B, a liquid crystal display device was fabricated in the same manner as in Example 1.

Example 4

Except that the red colored layer 13R of the frame portion 12 in Example 1 was changed to a stripe pattern containing a red colored layer 13R, a green colored layer 13G, and a blue colored layer 13B, a liquid crystal display device was fabricated in the same manner as in Example 1 (refer to the second example shown in FIGS. 2A to 2E).

Example 5

Except that a green colored layer 13G and a blue colored layer 13B were laminated on the red colored layer 13R of the frame portion 12 in Example 1, a liquid crystal display device was fabricated in the same manner as in Example 1 (refer to the third example shown in FIG. 3).

Example 6

Except that the order of formation of the red pattern and the green pattern was reversed, a liquid crystal display device was fabricated in the same manner as in Example 5.

Example 7

Except that the order of formation of the red pattern and the blue pattern was reversed, a liquid crystal display device was fabricated in the same manner as in Example 5.

Example 8

Except that the red curable resin composition was changed as described below, a liquid crystal display device was fabricated in the same manner as in Example 1.
<Composition of Red Curable Resin Composition>
C.I. Pigment Red 177: 4.5 weight parts
C.I. Pigment Red 254: 5.5 weight parts
Polysulfonic acid-type polymeric dispersant: 3 weight parts
Curable resin composition A: 20 weight parts
3-Methoxybutyl acetate: 67 weight parts

Comparative Example 1

Except that the red colored layer 13R was not formed in the frame portion 12, a liquid crystal display device was fabricated in the same manner as in Example 1.

Each liquid crystal display device, fabricated as in the above-mentioned Example 1 to Example 8, and Comparative Example, was subjected to measurement of reflectance-wavelength characteristics (reflection spectrometry) from the viewer's side when display was turned off by using a microspectro device OSP-SP2000™ (manufactured by Olympus Corporation). From the data obtained, there were obtained respective color coordinates (x, y) and brightness Y in the XYZ color coordinate system according to JIS Z8701 as measured by illuminant C.

The results came out as shown in Table 2.

TABLE 2

| | Non-display area (frame portion) | | | Display area (open portion) | | | (Value in non-display area) − (Value in display area) | | | Evaluation |
|---|---|---|---|---|---|---|---|---|---|---|
| | x | y | Y | x | y | Y | Δx | Δy | ΔY | |
| Example 1 | 0.363 | 0.358 | 2.02 | 0.306 | 0.321 | 1.36 | 0.057 | 0.037 | 0.66 | ◉ |
| Example 2 | 0.321 | 0.363 | 2.41 | 0.306 | 0.321 | 1.36 | 0.015 | 0.042 | 1.05 | ○ |
| Example 3 | 0.307 | 0.305 | 2.80 | 0.306 | 0.321 | 1.36 | 0.001 | −0.016 | 1.44 | ○ |
| Example 4 | 0.326 | 0.337 | 2.41 | 0.306 | 0.321 | 1.36 | 0.020 | 0.016 | 1.05 | ○ |
| Example 5 | 0.360 | 0.361 | 1.03 | 0.306 | 0.321 | 1.36 | 0.054 | 0.040 | −0.33 | ◉ |
| Example 6 | 0.323 | 0.362 | 1.43 | 0.306 | 0.321 | 1.36 | 0.017 | 0.041 | 0.07 | ◉ |
| Example 7 | 0.312 | 0.308 | 1.83 | 0.306 | 0.321 | 1.36 | 0.006 | −0.013 | 0.47 | ◉ |
| Example 8 | 0.358 | 0.356 | 1.82 | 0.304 | 0.321 | 1.33 | 0.054 | 0.036 | 0.49 | ◉ |
| Comparative Example 1 | 0.322 | 0.336 | 3.10 | 0.306 | 0.321 | 1.36 | 0.016 | 0.015 | 1.74 | X |

Evaluation criteria were: ◉ (Excellent), when the difference in Y value between the region for display and the region not for display was less than 1.0; ○ (Good), when the difference was no less than 1.0 and no more than 1.5; and x (Poor), when the difference was more than 1.5.

REFERENCE NUMERALS

10: Color filter forming substrate
11: Base material (transparent substrate)
12: Frame portion
12a1, 12a2, 12a3: Reflection controlling layer
12b: Light-shielding colored layer
13: Colored layer
13R: Red colored layer
13G: Green colored layer
13M: Colored layer for black matrix (also referred to as "light-shielding colored layer")
13B: Blue colored layer
13S: Region for display
13A: Colored layer (for measurement)
14: Protective layer (also referred to as "overcoat layer" or "OC layer")
20: Oil for refractive index adjustment
30: Black plate
40: Detector
45: Inspection light
110: Color filter forming substrate
111: Base material (transparent substrate)
112: Frame portion
113: Colored layer
113s: Region for display
114: Protective layer (also referred to as "overcoat layer" or "OC layer")
120: Display device (also referred to as a tablet display device or a multifunctional terminal)
121: Frame
122: Display area (also referred to as "colored layer forming region for color filter")
123: Non-display area (also referred to as "frame region")

The invention claimed is:

1. A color filter forming substrate, comprising:
a transparent substrate as a base material; and, on one side of the base material, colored layers of respective colors for a color filter disposed in a region for display and a light-shielding frame portion disposed as a region not for display around outside of the region for display; and the color filter forming substrate is used for a display device,
wherein the region for display is placed in middle region of the color filter forming substrate,
wherein the region not for display is placed in periphery region of the color filter forming substrate,
wherein the frame portion has a reflection controlling layer and a black matrix light shielding colored layer laminated in this order from the base material side, and the reflection controlling layer is either one of a red, green, or blue colored layer.

2. The color filter forming substrate according to claim 1, wherein the reflection controlling layer is disposed separately by using a layer different from respective layers used for the color filter forming substrate.

3. A method for manufacturing a color filter forming substrate, the color filter forming substrate comprises:

a transparent substrate as a base material; and, on one side of the base material, colored layers of respective colors for a color filter disposed in a region for display and a light-shielding frame portion disposed as a region not for display around outside of the region for display;

the color filter forming substrate is used for a display device; the region for display is placed in middle region of the color filter forming substrate;

the region not for display is placed in periphery region of the color filter forming substrate;

the frame portion has, a colored layer for the reflection controlling layer and a black matrix light shielding colored layer laminated in this order from the base material side, and the reflection controlling layer is either one of a red, green, or blue colored layer, wherein the colored layers of respective colors for the color filter, the black matrix light shielding colored layer which separates the colored layers of respective colors, the colored layer which becomes the reflection controlling layer of the frame portion, and the black matrix light shielding colored layer of the frame portion are each formed by one photolithography process;

wherein the whole colored layer which becomes the reflection controlling layer of the frame portion is formed in at least one of the respective photolithography processes for forming the colored layers of respective colors for the colored filter; and wherein the black matrix light shielding colored layer of the frame portion is formed on the whole colored layer which becomes the reflection controlling layer in the photolithography process for forming the black matrix light shielding colored layer.

4. A display device using a color filter forming substrate for a display device, the color filter forming substrate comprises a transparent substrate as a base material; and, on one side of the base material, colored layers of respective colors for a color filter disposed in a region for display and a frame portion comprising a black matrix light shielding colored layer disposed as a region not for display around a periphery of the region for display, wherein the color filter forming substrate according to claim 1 is used.

* * * * *